US012721218B2

(12) United States Patent
Toma et al.

(10) Patent No.: US 12,721,218 B2
(45) Date of Patent: Aug. 25, 2026

(54) OPTICAL COMMUNICATION FOR MEMORY DISAGGREGATION IN HIGH PERFORMANCE COMPUTING

(71) Applicant: Google LLC, Mountain View, CA (US)

(72) Inventors: Horia Alexandru Toma, Sunnyvale, CA (US); Zuowei Shen, Los Altos, CA (US); Hong Liu, Palo Alto, CA (US); Yujeong Shim, Cupertino, CA (US); Biao He, Sunnyvale, CA (US); Jaesik Lee, San Jose, CA (US); Georgios Konstadinidis, San Jose, CA (US); Teckgyu Kang, Saratoga, CA (US); Igor Arsovski, Williston, VT (US); Sukalpa Biswas, Fremont, CA (US)

(73) Assignee: Google LLC, Mountain View, CA (US)

( * ) Notice: Subject to any disclaimer, the term of this patent is extended or adjusted under 35 U.S.C. 154(b) by 578 days.

(21) Appl. No.: 17/992,241

(22) Filed: Nov. 22, 2022

(65) Prior Publication Data

US 2023/0343768 A1 Oct. 26, 2023

Related U.S. Application Data

(60) Provisional application No. 63/334,395, filed on Apr. 25, 2022.

(51) Int. Cl.
*H10W 90/00* (2026.01)

(52) U.S. Cl.
CPC .................................. *H10W 90/00* (2026.01)

(58) Field of Classification Search
CPC . H01L 25/167; H01L 25/0652; H01L 25/065; H01L 25/18; H01L 2225/06534;
(Continued)

(56) References Cited

U.S. PATENT DOCUMENTS 10,742,217 B2 8/2020 Dabral et al.
2004/0145935 A1* 7/2004 Jakobs .................. G11C 29/26 365/49.1

(Continued)

FOREIGN PATENT DOCUMENTS

CN 113394206 A 9/2021
CN 114256224 A 3/2022

(Continued)

OTHER PUBLICATIONS

Notice of Allowance for Korean Patent Application No. 10-2023-0012735 dated Nov. 15, 2024. 3 pages.

(Continued)

*Primary Examiner* — Ilker Ozden
(74) *Attorney, Agent, or Firm* — Lerner David LLP

(57) ABSTRACT

The technology generally relates to disaggregating memory from an application specific integrated circuit ("ASIC") package. For example, a high-bandwidth memory ("HBM") optics module package may be connected to an ASIC package via one or more optical links. The HBM optics module package may include HBM dies(s), HBM chiplet(s) and an optical chiplet. The optical chiplet may be configured to connect the HBM optics module to one or more optical fibers that form an optical link with one or more other components of the ASIC package. By including an optical chiplet in the HBM optics module package, the HBM optics module package may be disaggregated from an ASIC package.

13 Claims, 3 Drawing Sheets

(58) Field of Classification Search
CPC ....... G11C 5/02; G11C 7/1054; G11C 7/1081; G11C 2207/105; G06F 15/7807; G06F 15/7864; G02B 6/42; H10W 90/00
See application file for complete search history.

(56) References Cited

U.S. PATENT DOCUMENTS

| | | | | |
|---|---|---|---|---|
| 2005/0111786 | A1* | 5/2005 | Boie | B81B 7/0077 385/18 |
| 2015/0081989 | A1* | 3/2015 | Lee | G06F 12/0607 711/157 |
| 2018/0233907 | A1* | 8/2018 | Dubowski | H10D 89/931 |
| 2021/0133913 | A1 | 5/2021 | Matam et al. | |
| 2021/0258078 | A1* | 8/2021 | Meade | G11C 11/4096 |
| 2021/0335393 | A1* | 10/2021 | Zhao | G11C 5/04 |
| 2022/0092016 | A1* | 3/2022 | Kumashikar | G06F 13/4068 |
| 2022/0107808 | A1 | 4/2022 | Enamandram et al. | |
| 2022/0200183 | A1* | 6/2022 | Nekkanty | G02B 6/4274 |
| 2022/0327083 | A1* | 10/2022 | Das Sharma | H01L 25/18 |
| 2022/0365583 | A1* | 11/2022 | Vijayrao | G11C 7/1054 |

FOREIGN PATENT DOCUMENTS

| | | | |
|---|---|---|---|
| KR | 20210084226 | A | 7/2021 |
| KR | 2021-0116202 | A | 9/2021 |
| TW | 202209323 | A | 3/2022 |

OTHER PUBLICATIONS

Extended European Search Report for European Patent Application No. 23151739.2 dated Sep. 28, 2023. 10 pages.

Office Action for Korean Patent Application No. 10-2023-0012735 dated May 16, 2024. 7 pages.

Wade, Mark, Ayar Labs, "TeraPHY: A Chiplet Technology for Low-Power, High-Bandwidth In-Package Optical I/O, HotChips 2019, 0/20/19, 48 pages.Wade, Mark,"TeraPHY: A Chiplet Technology for Low-Power, High-Bandwidth In-Package Optical 1.

"High Bandwidth Memory (HBM) System Assembly", Technical Disclosure Commons, May 25, 2021, https://www.tdcommons.org/dpubs_series/4331, 9 pages.

Meade, R. et al., "TeraPHY: A High-density Electronic-Photonic Chiplet for Optical I/O from a Multi-Chip Module", OFC 2019, 3 pages.

Office Acion for Chinese Patent Application No. 202211694594.1 dated Sep. 30, 2025. 7 pages.

Office Action for Taiwanese Patent Application No. 112103768 dated Nov. 10, 2025. 7 pages.

Office Action for European Patent Application No. 23151739.2 dated Nov. 20, 2025. 7 pages.

Decision of Rejection for Chinese Patent Application No. 202211694594.1 dated Jun. 6, 2026. 8 pages.

Von Trapp. An Inside Look at 3D-DfT Standard IEEE Std 1838TM-2019. Mar. 17, 2020. 6 pages. Retrieved from the Internet: <https://www.3dincites.com/2020/03/an-inside-look-at-3d-dft-standard-ieee-std-1838-2019/>.

* cited by examiner

300

OPTICAL COMMUNICATION FOR MEMORY DISAGGREGATION IN HIGH PERFORMANCE COMPUTING

CROSS REFERENCE TO RELATED APPLICATIONS

This application claims the benefit of the filing date of U.S. Provisional Patent Application No. 63/334,395 filed Apr. 25, 2022, the disclosure of which is hereby incorporated herein by reference.

BACKGROUND

High performance computing may require a plurality of high bandwidth memory ("HBM") dies. HBM may provide greater bandwidth while using less power as compared to other types of memory. Typically, HBM dies are integrated within application specific integrated circuit ("ASIC") packages. As the performance requirements of ASIC packages increase, additional HBM dies may be necessary to provide the bandwidth and capacity for the increased performance. However, the number of HBM dies integrated in an ASIC package may be limited due to space constraints of the ASIC package, power constraints of the ASIC package, and/or the thermal constraints of the ASIC package. Moreover, for ASIC packages having integrated HBM dies, a defect in any HBM die may make the entire ASIC package inoperable. As such, the entire ASIC package, including the ASIC die, may have to be replaced due to a faulty HBM die, which may be costly and wasteful.

BRIEF SUMMARY

The technology generally relates to disaggregating memory from an ASIC package. The memory may be, for example, HBM. The HBM die may be part of a HBM optics module package that is optically connected to the ASIC package. The HBM optics module package may include HBM die(s), HBM chiplet(s) and optical chiplet(s). Optical chiplets may be configured to optically connect the HBM optics module package to the ASIC package. By optically connecting the HBM optics module package to the ASIC package, the HBM dies may be disaggregated from the ASIC package. By disaggregating the HBM dies from the ASIC package, additional HBM dies may be connected to the ASIC package regardless of the size of the footprint of the ASIC package, the thermal constraints of the ASIC package, and/or the power constraints of the ASIC package. Disaggregating the HBM dies from the ASIC package may, additionally or alternatively, provide for reduced repair costs as only the faulty component on the HBM optics module package would have to be replaced as compared to an entire ASIC package.

One aspect of the technology is directed to a package comprising one or more high-bandwidth memory (HBM) dies, a HBM chiplet connected to the one or more HBM modules, and an optical chiplet coupled to the HBM chiplet and connected to one or more optical fibers. The optical chiplet may be configured to connect the one or more HBM modules to a separate optical component via the one or more optical fibers.

The separate optical component may be an application specific integrated circuit (ASIC) die. The package may include a respective socket for the one or more HBM dies, the HBM chiplet, and the optical chiplet. The one or more HBM dies, the HBM chiplet, and the optical chiplet may be removably coupled to the package. The HBM chiplet may include a first die-to-die (D2D) and the optical chiplet includes a second D2D. The HBM chiplet may communicate with the optical chiplet via a D2D interface between the first D2D and the second D2D.

Another aspect of the technology is directed to a system, comprising a first package and a second package optically coupled to the first package. The second package may comprise one or more high-bandwidth memory (HBM) dies, a HBM chiplet connected to the one or more HBM modules, and an optical chiplet coupled to the HBM chiplet and connected to one or more optical fibers. The optical chiplet may be configured to connect the second package to the first package via the one or more optical fibers.

The first package may be an application specific integrated circuit (ASIC) die. The ASIC die may include one or more optical interfaces. Each of the one or more optical interfaces may be configured to be connected to the one or more optical fibers.

The optical chiplet may include one or more first fiber ports configured to receive a respective first end of one of the one or more optical fibers and the one or more optical interfaces may include one or more second fiber ports configured to receive a respective second end of the one or more optical fibers.

The second package may include a respective socket for the one or more HBM dies, the HBM chiplet, and the optical chiplet. The one or more HBM dies, the HBM chiplet, and the optical chiplet are removably coupled to the second package. The HBM chiplet may include a first die-to-die (D2D) and the optical chiplet includes a second D2D. The HBM chiplet may communicate with the optical chiplet via a D2D interface between the first D2D and the second D2D.

DETAILED DESCRIPTION

Figure 1:
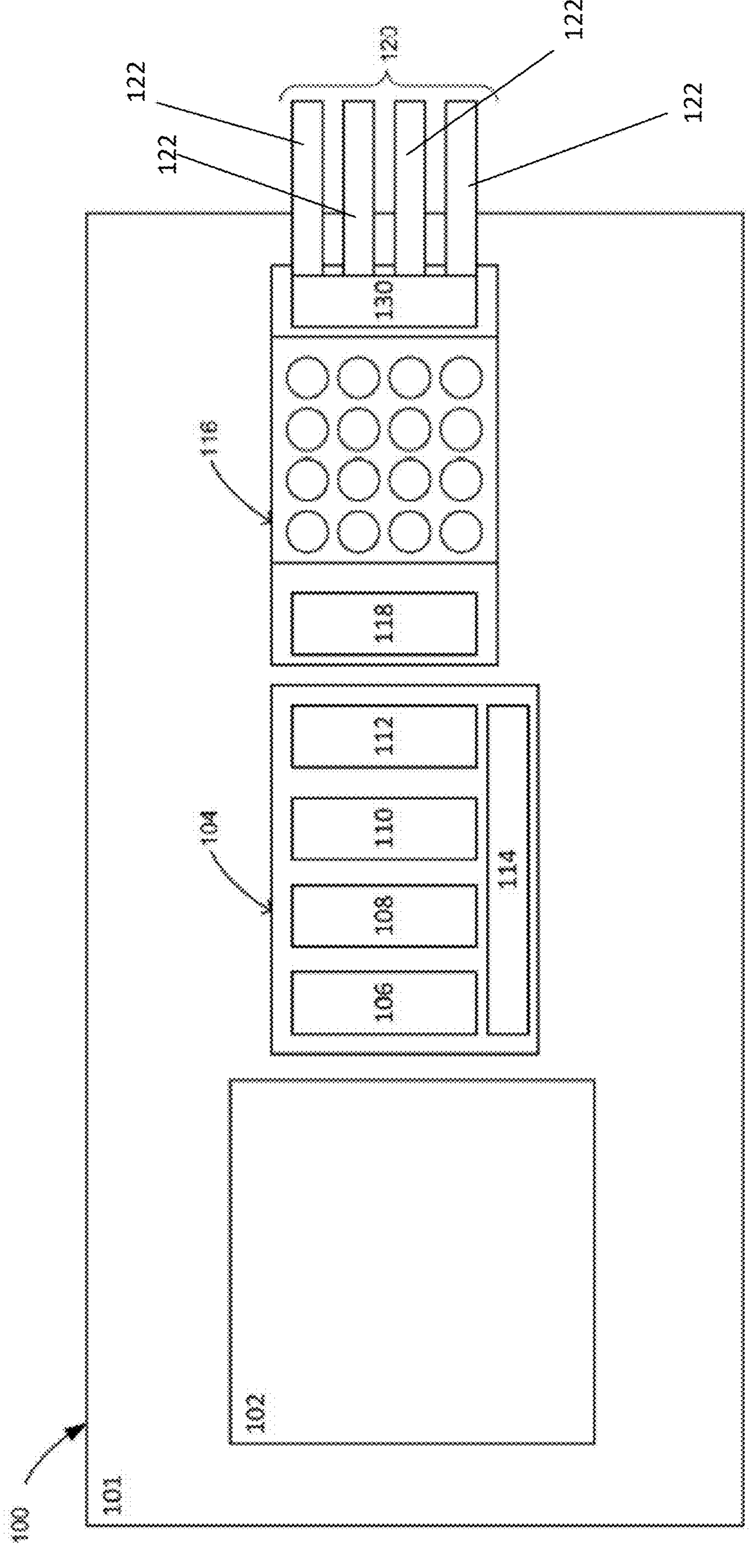
FIG. 1 illustrates an example package according to aspects of the disclosure.

The technology generally relates to disaggregating memory from an application specific integrated circuit ("ASIC") package. For example, a high-bandwidth memory ("HBM") optics module package may be connected to an ASIC package via one or more optical links. The HBM optics module package may include HBM die(s), HBM chiplet(s) and optical chiplet(s). The optical chiplets may be configured to connect the HBM optics module package to one or more optical fibers that form an optical link with one or more other components of the ASIC package. By including an optical chiplet in the HBM optics module package, HBM dies may be disaggregated from an ASIC package.

The optical links between the HBM optics module package and the ASIC package may allow for the HBM optics modules package and, therefore, the HBM dies to be positioned significantly further from an ASIC die as compared to when HBM dies are integrated within an ASIC package. As the connection between the HBM optics module package and ASIC package is an optical connection, little to no performance degradation results, even with the increased distance between the HBM dies and the ASIC package.

As used herein, channel reach refers to the distance a signal can travel over an optical or electrical connection. The channel reach of an optical link may be further than the channel reach of an electrical link. By disaggregating the HBM dies, and incorporating the HBM dies into an HBM optics module package, system designers gain increased flexibility as to where HBM dies can be located with respect to the ASIC package by leveraging the longer channel reach afforded by optical links. Moreover, ASIC package sizes may be reduced, as the HBM dies may be positioned outside of the ASIC package.

As the performance requirements of ASIC packages increases, more HBM dies may be required to provide the memory bandwidth and capacity for the increased performance. The increase in ASIC performance requirement may limit how many HBM dies can be placed on the ASIC package. The available package size or the ASIC footprint may limit how many HBM dies are placed on the package. For example, the package size may allocate a predetermined amount of space for HBM dies based on the other components that also have to be connected to the package. Therefore, the amount of space for HBM dies may be limited without enlarging the package. The number of HBM dies placed on the package may, additionally or alternatively, be limited based on the power and thermal constraints of the package. For example, including additional HBM dies on the package may cause an increase in thermal output. The increase in thermal output may exceed the thermal constraints of the package and, therefore, may damage components within the package and/or the package itself.

By incorporating HBM dies into HBM optical module packages, the HBM dies may be disaggregated from the ASIC module and connected via one or more optical fibers. Disaggregating the HBM dies from the ASIC module may increase the number of HBM dies that can be connected to the ASIC package.

FIG. 1 illustrates a HBM optics module package from a top view. The HBM optics module package 100 may include a plurality of components, such as HBM dies(s) 102, a HBM chiplet 104, and optics chiplet(s) 116. Although FIG. 1 shows an example HBM optics module package 100 with one HBM die 102, HBM chiplet 104, and optics chiplet 116, a HBM optics module package can include any number of HBM dies 102, HBM chiplets 104, and optics chiplets 116. Therefore, the configuration shown in FIG. 1 is merely one example and is not intended to be limiting.

Each component of the HBM optics module package 100 may be connected to one or more substrates, such as circuit boards, within the HBM optics module package 100. For instance, the components may be connected via one or more sockets to the main substrate 101 or sub-substrates connected to the main substrate. In some instances, each component may be removably connected to a substrate. In such a configuration, each component may be replaced with an upgraded component. In some examples, each component may be replaced if the component fails. In contrast, an ASIC package with an integrated HBM would require replacement of the entire ASIC package upon the failure of a single component, or a difficult and time consuming repair process to replace the failed component.

The HBM chiplet 104 may include a HBM physical interface ("PHY") 106, a HBM controller 108, an adaptor 110, a die-to-die ("D2D") interface 112, and a chip manager ("CM"), design for testing ("DFT"), and general purpose input/output ("GPIO") 114.

The HBM PHY 106 may, for example, receive commands from the HBM controller 108 and transmit the commands to the HBM die(s) 102. The HBM controller 108 may, for example, optimize the memory traffic and improve the overall performance of the HBM chiplet 104, HBM die(s) 102, and/or HBM optics module package 100.

The adaptor 110 may allow for independent testing of the components on the HBM optics module package 100. The independent testing may be performed via one or more external interfaces. According to some examples, the testing may be joint test action group ("JTAG") testing and/or screening of defective parts. Independent testing of the components may reduce any downtime due to a defective component and/or the total cost of ownership of the HBM optics module package. In some examples, if adaptor 110 determines that a component has failed and/or is defective, adaptor 110 may transmit a notification identifying the failed or defective component. The component may be removed from its respective socket on the system main board and replaced with a functioning component. In such an example, replacing just the failed component may save time and money as compared to having to replace an entire ASIC package or HBM optics module package 100.

According to some examples, by identifying the failed or defective component, the downtime for replacing or repairing the HBM optics module package 100 may be reduced as compared to replacing a monolithic ASIC package. In such an example, the downtime may be limited to removing the failed component from its respective socket and replacing it with a new one. Additionally or alternatively, only the HBM optics module package 100 with the failed component may experience downtime during the repair. In contrast, for a monolithic package, the entire ASIC package may experience downtime. Moreover, if a component fails on the monolithic package, the entire package has to be replaced, which is costly.

The CM 114 may configure and manage the HBM chiplet 104, HBM die(s) 102, and/or the HBM optics module package 100.

The HBM chiplet 104 may be connected to both the HBM dies(s) 102 and the optical chiplet 116. The optical chiplet 116 may be connected to the HBM chiplet 104 via a D2D interface 118, 112. For example, the D2D 112 of the HBM chiplet 104 may communicate with a D2D 118 of the optical chiplet 116. The D2D interface 112, 118 may be a high-bandwidth interface ("HBI").

The optical chiplet 116 may include a D2D 118, one or more optical fiber ports 120, and a load balancing ("LB") physical interface ("PHY") 130. Each optical fiber port 120 may be configured to receive a respective optical fiber 122. The optical fibers 122 may connect from the optical chiplet 116 to a separate component. For example, the optical fibers 122 may connect the optics chiplet 116 to an ASIC package. By coupling the optical fibers 122 to the optical chiplet 116, the HBM optics module package 100 may be disaggregated from the ASIC package. In this regard, the optical fiber 122 may extend the channel reach between the HBM optics module package 100 and the ASIC package as compared to an electrical connection between the HBM die(s) and the ASIC package.

The LB PHY 130 may be configured to control the data being transmitted to and/or received from an ASIC package.

Figure 2:
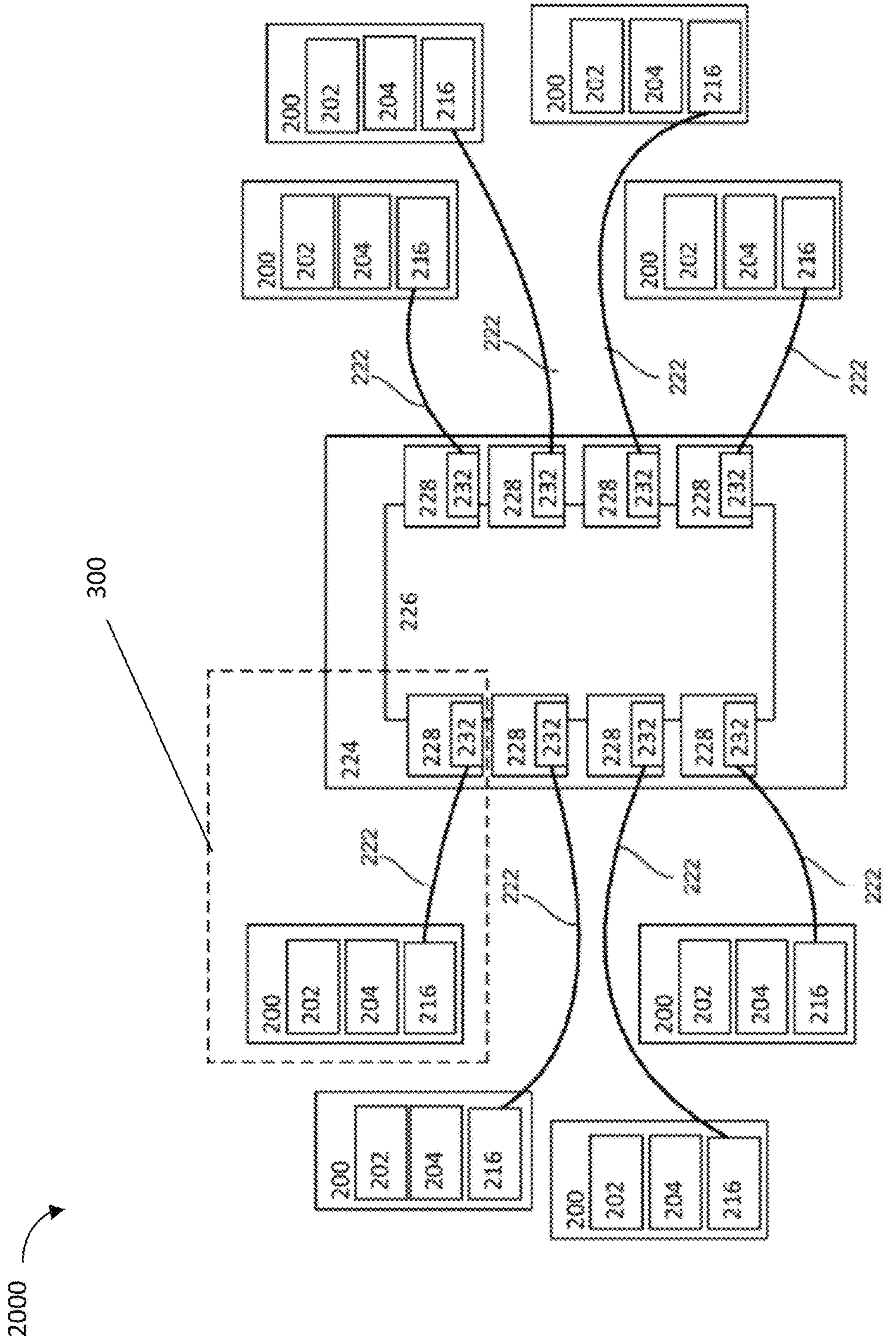
FIG. 2 illustrates an example system according to aspects of the disclosure.

FIG. 2 illustrates an example system with the HBM disaggregated from the ASIC package. The system 2000 may include an ASIC package 224 and a plurality of HBM optics module packages 200. Each HBM optics module package 200 may include HBM die(s) 202, HBM chiplet(s) 204, and optical chiplet(s) 216. Each HBM optics module package 200 may be connected to the ASIC package 224 by one or more optical fibers 222. The ASIC package 224 may be, for example, a tensor processing unit ("TPU").

ASIC package 224 may include an interconnect 226 and a plurality of optical interfaces 228. The interconnect 226 may be, for example, a bus or an interconnect interface ("ICI"). The interconnect 226 may be configured to communicate with an interconnect of another ASIC package. The interconnect 226 may include a D2D interface. The D2D of the interconnect 226 may be connected to a D2D interface of a respective optical interface 228.

Figure 3:
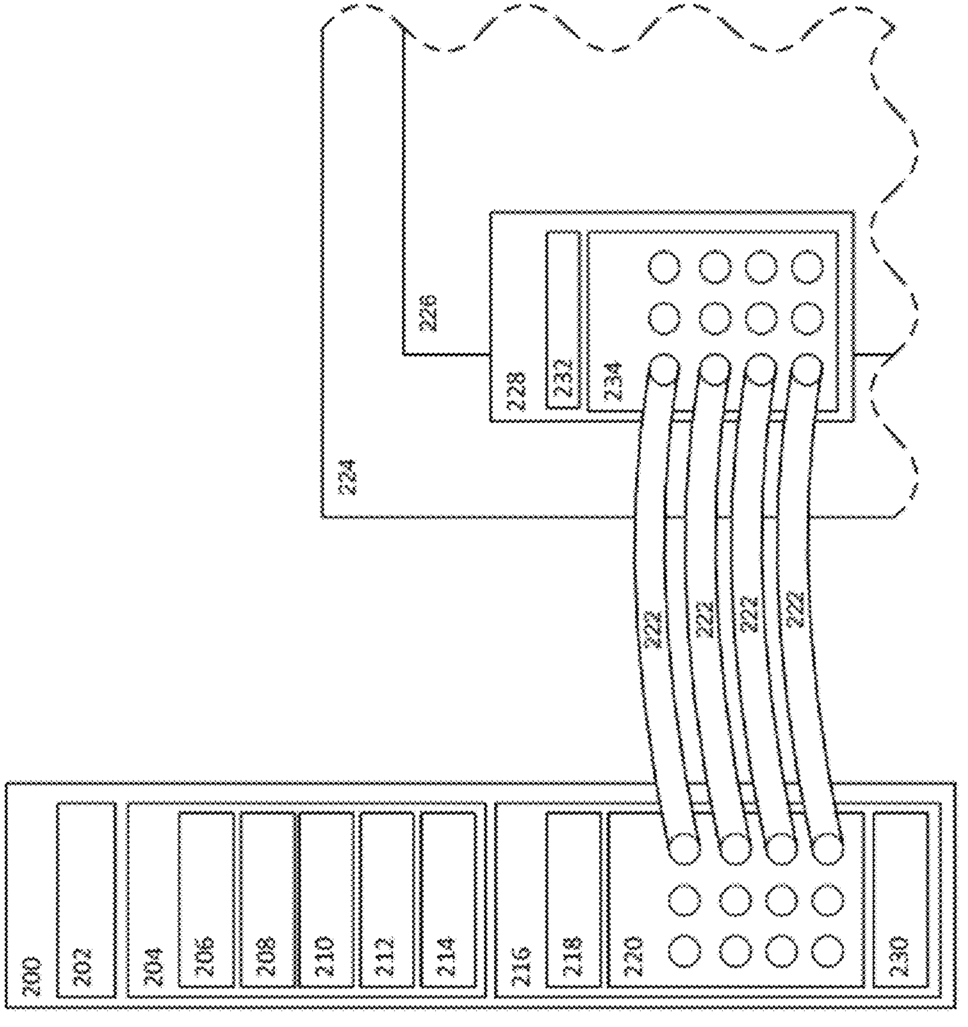
FIG. 3 illustrates a detailed section of the example system of FIG. 2 according to aspects of the disclosure.

Optical interface 228 may include a load balancing ("LB") physical interface ("PHY") 232. Similar to LB PHY 130 of the HBM optics module package 100, LB PHY 232 may be configured to control how much data is being transmitted to and/or received from HBM optics module package 200. Optical interface 228 may, additionally or alternatively, include one or more optical fiber ports 234, as shown in FIG. 3. Each optical fiber port 234 may be configured to receive a respective optical fiber 222. The optical fibers 222 may connect each HBM optics module package 200 to a respective optical interface 228.

FIG. 3 illustrates a zoomed-in block drawing of the portion 300 of system 2000. Portion 300 includes HBM optics module package 200 optically connected to optical interface 228. The optical interface may be connected to interconnect 226.

A plurality of optical fibers 222 may extend each fiber port 220 on HBM optics module package 200 to a respective fiber port 234 on interface 228. While twelve fiber ports 220, 234 are shown on HBM optics module package 200 and interface 228, there may be any number of optical ports. For example, there may be one, five, twenty, etc. Thus, twelve fiber ports 220, 234 is merely one example and is not intended to be limiting. Further, FIG. 3 illustrates four optical fibers 222 extending between fiber ports 220 on HBM optics module 200 package and fiber ports 234 on interface 228 for clarity purposes only. There may be, for example, an optical fiber 222 extending from each fiber port 220 on HBM optics module package 200 to a respective fiber port 234 on interface 228. Therefore, in some examples, the number of optical fibers 222 extending between HBM optics module package 200 and interface 228 may correspond to the number of fiber ports 220, 234. In some examples, the number of optical fibers 222 may be less than the number of fiber ports 220, 234 such that there are empty fiber ports 220, 234.

The optical fibers 222 connecting the HBM optics module package 200 to ASIC package 224 may extend the channel reach between the HBM optics module package 200 and the ASIC package 224. The channel reach of an optical link may be further than the channel reach of an electrical link. Extending the channel reach between the HBM optics module package 200 and the ASIC package 224 may, for example, provide flexibility as to where the HBM optics module package 200 is located with respect to the ASIC package 224. For example, the extended channel reach may allow for the HBM optics module package 200 and, therefore, HBM 204 to be disaggregated from the ASIC package 224.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the examples should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A package comprising:

one or more high-bandwidth memory (HBM) dies;

a HBM chiplet connected to the one or more HBM dies; and an optical chiplet coupled to the HBM chiplet and connected to one or more optical fibers, wherein the HBM chiplet comprises an adaptor for independent testing of each of the HBM chiplet, the one or more HBM dies, and the optical chiplet, wherein the optical chiplet is configured to connect the one or more HBM dies to a separate optical component via the one or more optical fibers, and wherein each of the one or more HBM dies, the HBM chiplet, and the optical chiplet are removably coupled to the package.

2. The package of claim 1, wherein the separate optical component is an application specific integrated circuit (ASIC) die.

3. The package of claim 1, wherein the package includes a respective socket for the one or more HBM dies, the HBM chiplet, and the optical chiplet.

4. The package of claim 1, wherein the HBM chiplet includes a first die-to-die (D2D) and the optical chiplet includes a second D2D.

5. The package of claim 4, wherein the HBM chiplet communicates with the optical chiplet via a D2D interface between the first D2D and the second D2D.

6. A system, comprising:

a first package;

a second package optically coupled to the first package, the second package comprising:

one or more high-bandwidth memory (HBM) dies;

a HBM chiplet connected to the one or more HBM dies; and an optical chiplet coupled to the HBM chiplet and connected to one or more optical fibers, wherein the HBM chiplet comprises an adaptor for independent testing of each of the HBM chiplet, the one or more HBM dies, and the optical chiplet, wherein the optical chiplet is configured to connect the second package to the first package via the one or more optical fibers, and wherein each of the one or more HBM dies, the HBM chiplet, and the optical chiplet are removably coupled to the second package.

7. The system of claim 5, wherein the first package is an application specific integrated circuit (ASIC) die.

8. The system of claim 6, wherein the ASIC die includes one or more optical interfaces.

9. The system of claim 7, wherein each of the one or more optical interfaces is configured to be connected to the one or more optical fibers.

10. The system of claim 7, wherein:

the optical chiplet includes one or more first fiber ports configured to receive a respective first end of one of the one or more optical fibers, and the one or more optical interfaces includes one or more second fiber ports configured to receive a respective second end of the one or more optical fibers.

11. The system of claim 5, wherein the second package includes a respective socket for the one or more HBM dies, the HBM chiplet, and the optical chiplet.

12. The system of claim 5, wherein the HBM chiplet includes a first die-to-die (D2D) and the optical chiplet includes a second D2D.

13. The system of claim 6, wherein the HBM chiplet communicates with the optical chiplet via a D2D interface between a first D2D and a second D2D.

* * * * *